US012265055B2

United States Patent
Lee et al.

(10) Patent No.: US 12,265,055 B2
(45) Date of Patent: Apr. 1, 2025

(54) METHOD OF PROVIDING CONTACTS ON A GRAPHENE SHEET

(71) Applicant: PARAGRAF LIMITED, Somersham (GB)

(72) Inventors: Lok Yi Lee, Somersham (GB); Hugh Glass, Somersham (GB); Simon Thomas, Somersham (GB); Ivor Guiney, Somersham (GB)

(73) Assignee: Paragraf Limited, Somersham (GB)

( * ) Notice: Subject to any disclaimer, the term of this patent is extended or adjusted under 35 U.S.C. 154(b) by 646 days.

(21) Appl. No.: 17/533,540

(22) Filed: Nov. 23, 2021

(65) Prior Publication Data
US 2022/0178872 A1    Jun. 9, 2022

(30) Foreign Application Priority Data

Dec. 9, 2020 (GB) ..................................... 2019412

(51) Int. Cl.
*H01L 21/3065* (2006.01)
*G01N 27/414* (2006.01)
(Continued)

(52) U.S. Cl.
CPC ..... *G01N 27/4145* (2013.01); *H01L 21/3065* (2013.01); *H01L 29/1606* (2013.01); *H01L 29/66045* (2013.01)

(58) Field of Classification Search
None
See application file for complete search history.

(56) References Cited

U.S. PATENT DOCUMENTS

| 2011/0104442 A1* | 5/2011 | Yoon | B82Y 40/00 977/734 |
| 2012/0088039 A1* | 4/2012 | Yu | B82Y 40/00 427/596 |

(Continued)

FOREIGN PATENT DOCUMENTS

| CN | 104282749 A | 1/2015 |
| EP | 3131121 A1 | 2/2017 |

(Continued)

OTHER PUBLICATIONS

Great Britain Search Report, Application No. 2019412.2, dated May 14, 2021, 7 pages.

(Continued)

*Primary Examiner* — Shamim Ahmed
(74) *Attorney, Agent, or Firm* — Stinson LLP

(57) ABSTRACT

The present invention relates to a method of forming a material on a graphene layer structure 5 for injecting charge into, or extracting charge out of, the graphene layer structure 5, the method comprising:
 providing a graphene layer structure 5 having one or more first portions 25 on a non-metallic substrate 10, said one or more first portions 25 having one or more surface defects comprising excess out-of-plane material 15;
 plasma etching the one or more first portions 25 of the graphene layer structure 5 to remove the out-of-plane material 15;
 depositing a material 30 for injecting charge into, or extracting charge out of, the graphene layer structure 5 onto the one or more plasma-etched first portions 25.

14 Claims, 4 Drawing Sheets

(51) Int. Cl.
*H01L 29/16* (2006.01)
*H01L 29/66* (2006.01)

(56) References Cited

U.S. PATENT DOCUMENTS

| | | | | |
|---|---|---|---|---|
| 2012/0212242 | A1* | 8/2012 | Masel | G01N 27/127 |
| | | | | 324/693 |
| 2013/0309776 | A1* | 11/2013 | Drndic | G01N 33/48721 |
| | | | | 264/405 |
| 2014/0077161 | A1* | 3/2014 | Duan | H01L 29/66439 |
| | | | | 257/29 |
| 2016/0176713 | A1* | 6/2016 | Loh | H01L 21/02502 |
| | | | | 438/479 |
| 2017/0102358 | A1 | 4/2017 | Hoffman | |
| 2017/0356869 | A1* | 12/2017 | Koenig | G01N 27/121 |
| 2019/0383770 | A1* | 12/2019 | Choi | G01N 27/44791 |
| 2020/0127300 | A1* | 4/2020 | Prinz | H01M 4/886 |
| 2020/0235212 | A1* | 7/2020 | Lu | H01L 29/1606 |

FOREIGN PATENT DOCUMENTS

| | | |
|---|---|---|
| WO | 2012/112746 A1 | 8/2012 |
| WO | 2017/029470 A1 | 2/2017 |
| WO | 2018/098286 A1 | 5/2018 |

OTHER PUBLICATIONS

Geim et al., "The Rise of Graphene", Nature Materials, vol. 6, 183-191, Mar. 2007 and in the focus issue of Nature Nanotechnology, vol. 9, Issue 10, Oct. 2014.

Tian et al., "A Review on Lattice Defects in Graphene: Types, Generation, Effects and Regulation", Micromachines (Basel) 2017, May 8(5), 15 pages.

Deng et al., "Wrinkles, rippled, and crumpled graphene, an overview of formation mechanism, electronic properties and applications", Materials Today, vol. 19 No. 4, May 2016, 16 pages.

* cited by examiner

METHOD OF PROVIDING CONTACTS ON A GRAPHENE SHEET

REFERENCE TO RELATED APPLICATIONS

The present application claims the benefit of United Kingdom Application No. GB 2019412.2, filed Dec. 9, 2020, the entire contents of which are incorporated herein by reference.

FIELD OF THE INVENTION

The present invention relates to a method for forming a material on a graphene layer structure for injecting charge into, or extracting charge out of, the graphene layer structure. In particular, the method provides for the provision of improved electrical contacts or a more sensitive biosensor.

BACKGROUND

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, Volume 6, 183-191, March 2007 and in the focus issue of Nature Nanotechnology, Volume 9, Issue 10, October 2014.

While graphene theoretically has a perfect two-dimensional crystal structure providing its excellent electrical, thermal and mechanical properties, it is inevitable that lattice defects will be produced during the graphene production. The nature of these defects is discussed in "A Review on Lattice Defects in Graphene: Types, Generation, Effects and Regulation", Tian et. al, Micromachines (Basel) 2017, May 8(5) 163.

Defects have a great impact on the properties of crystals and nanostructures. Different types of defects could change the topology or the curvature and then change the structure of graphene. In most cases, these unavoidable defects can affect the mechanical properties as well as the thermal and electrical conductivities of graphene. High-resolution transmission electron microscopy (TEM) provides the capability to resolve every single atom in the graphene lattice, even for suspended single-layer graphene. In addition, the scanning electron microscope (SEM) and atomic force microscope (AFM) can also be used to characterise a graphene surface.

In general, defects in graphene can be categorized into two different groups: the first one is intrinsic defects, which is composed of non-$sp^2$ orbital hybrid carbon atoms in graphene. These defects are usually caused by the existence of non-hexagonal rings surrounded by hexagonal rings; the second defects are extrinsic defects whereby the crystalline order is perturbed with non-carbon atoms in graphene. The intrinsic defects of graphene can be divided into five categories: Stone-Wales defects, single vacancy defects, multiple vacancy defects, line defects and carbon adatoms. All of these defects can result in out-of-plane carbon atoms.

Graphene is commonly produced by vapour phase deposition onto a catalytic metal surface. The graphene is then transferred to a final substrate with an intervening treatment to etch away the catalytic material. The graphene produced in this way can have all of the intrinsic and extrinsic defects discussed above, as well as additional defects arising from the mechanical nature of the transfer process. Accordingly, the graphene surface on the final product generally has a large number of such defects.

WO 2017/029470, the content of which is incorporated herein by reference, discloses methods for producing two-dimensional materials, especially graphene, directly on the intended final non-metallic substrate. This helps to avoid the introduction of additional defects. Moreover, the method of WO 2017/029470 itself is suitable for providing very high quality graphene with a reduced number of defects.

Nonetheless, CVD-type techniques, including that of WO 2017/029470, inevitably have some defects as a consequence of the high temperature growth of the graphene. In particular, graphene is peculiar in having a negative thermal expansion coefficient, whereas the substrates on which it may be grown have positive thermal expansion coefficients. Accordingly, when cooled after high temperature growth the substrate contracts and the graphene expands, leading to the formation of "wrinkles".

Wrinkles are well known in the field of graphene manufacture and are discussed in more detail in "Wrinkles, rippled, and crumpled graphene, an overview of formation mechanism, electronic properties and applications", Deng et. al.; Materials Today, vol. 19 No. 4, May 2016.

US 2017/0102358 A1 relates to one dimensional and two-dimensional field effect transistors useful for chemical and biological analysis.

EP 3131121 A1 relates particularly to field-effect devices, associated methods and apparatus.

CN 104282749 A provides a method for manufacturing a semiconductor structure, which uses hexagonal boron nitride (h-BN) as the gate dielectric of a field-effect transistor to produce a novel nano-field-effect device.

WO 2018/098286 A1 relates generally to biomolecular sensing devices, and more particularly to the fabrication of biomolecular sensing devices for analysing DNA and related biomolecules in which the biomolecular sensing devices make use of graphene, including defective graphene.

WO 2012/112746 A1 relates to a graphene biosensor formed on an electrically insulating substrate with a single layer graphene sheet arranged between two metallic electrodes. The graphene sheet has perforations creating edges in the graphene sheet.

SUMMARY OF THE INVENTION

It is an object of the present invention to provide improved electrical connections on a graphene sheet material and provide an improved method for making such electrical connections to the graphene which overcome, or substantially reduce, problems associated with the prior art or at least provide a commercially useful alternative. It is a further object to provide a more sensitive biosensor.

Accordingly, in a first aspect there is provided a method of forming a material on a graphene layer structure for injecting charge into, or extracting charge out of, the graphene layer structure, the method comprising:
   providing a graphene layer structure having one or more first portions on a non-metallic substrate, said one or more first portions having one or more surface defects comprising excess out-of-plane material;
   plasma etching the one or more first portions of the graphene layer structure to remove the out-of-plane material;
   depositing a material for injecting charge into, or extracting charge out of, the graphene layer structure onto the one or more plasma-etched first portions.

BRIEF DESCRIPTION OF THE DRAWINGS

The present invention will now be described further with reference to the following non-limiting Figures, in which:

FIG. 1A shows a graphene layer structure 5, preferably a monolayer, provided on a silicon substrate 10. The graphene layer structure 5 comprises a wrinkle 15 providing an amount of material which is in an out-of-plane region 20. The wrinkle 15 falls within an area 25 intended for an electrical contact 30.

FIG. 1B shows the graphene layer structure 5 after an oxygen-plasma treatment of the area 25 only, whereby the graphene material forming the wrinkle 15 has been etched away. This leaves exposed edge surfaces 35 of the graphene layer structure.

FIG. 1C shows the graphene layer structure 5 after a contact deposition step, whereby a contact 30 is formed on the area 25 and the contact 30 is provided in contact with the exposed edge surfaces 35. Thus, an electronic component comprising a contact 30 deposited by such a method can be differentiated from the prior art at least by virtue of the whole of the area 25 having the contact 30 has a flat planar surface.

FIG. 2 shows the graphene layer structure 5 having the areas 25 intended for an electrical contact 30. Only the wrinkles and surface defects in the areas 25 are treated, since treating the wrinkles across the sheet would lead to breaks in the electrical conductivity of the sheet as a whole. By only treating the areas where electrical contacts are to be deposited, the electrical connectivity of the contacts is improved.

FIG. 4A relates to a graphene sheet with a lower wrinkle density than FIG. 3A.

FIG. 5 shows a configuration of a biosensor.

DETAILED DESCRIPTION

Figure 1A:
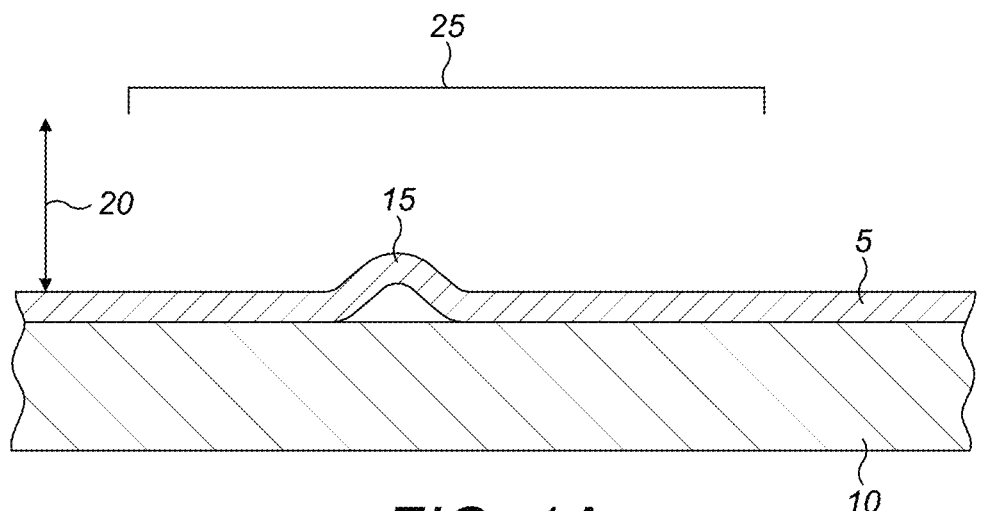
FIG. 1A-C show the stepwise treatment method as described herein.

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

There is always a drive to provide higher quality graphene sheets in order to improve the electrical properties that can achieved across the sheet. However, the present inventors have now realised that inherent defects in the graphene sheet can be used to provide improved electrical connections to the graphene sheet.

In particular, the inventors have found that when targeted plasma-etching is used to remove out-of-plane material (i.e. carbon atoms) from the areas where Ohmic contacts are to be formed, the subsequent electrical contacts had an improved electrical connection to the graphene sheet.

By "out-of-plane" it is meant that the material is not in the plane of the graphene sheet. Graphene is a well-known 2D material. A graphene sheet accordingly implicitly has a single plane, such that out-of-plane material can be readily identified. Such out-of-plane material is material (i.e. carbon atoms) that extends at least 0.5 nm, preferably at least 0.2 nm, from the plane of the graphene sheet.

The out-of-plane material in question will depend on the way in which the graphene is formed. Where the graphene has been formed by a hot CVD method, the out-of-plane material will comprise wrinkles resulting from the difference in coefficients of thermal expansion on cooling. When using a method such as that disclosed in WO 2017/029470, substantially all of the out-of-plane material is provided by such wrinkles. However, it should also be appreciated that the out-of-plane material can also comprise carbon atoms forming part of extrinsic or intrinsic defects, as well as partial layer fragments from incomplete multiple-layer growth. If the graphene has been transferred from another substrate then the transfer can also cause further damage resulting in additional out-of-plane material.

Without wishing to be bound by theory, it is believed that the method of etching by plasma primarily introduces line-breaks in the graphene on a nano-scale, providing gaps between graphene regions previously unachievable by standard etching processes. Accordingly, graphene regions may then be reconnected by depositing a metal contact (or biosensor material) across the adjacent regions. The charge carrier transfer between the graphene and the contact (or biosensor material) is improved at graphene edges due to the preferred conduction pathway thereby reducing resistance (as compared with vertical electron injection between the graphene surface and the contact).

Without wishing to be bound by theory, it is also believed that the method can also help to clean-up the graphene surface, enhancing the connection between the contact (or biosensor material) and the graphene surface, such as by removing partial layer fragments The inventors have further realised that were the treatment to be carried out across the whole surface of the graphene then this would actually serve to degrade the electrical performance of the sheet, since without the further deposition of the contact material, there would be breaks and discontinuities in the graphene surface. Accordingly, they have devised strategies for the targeted plasma treatment of the graphene surface. That is, the metal contact bridging the adjacent graphene grains allows for highly reduced contact resistance and etching need only be applied in the area of contact deposition thereby maintaining continuity in the rest of the graphene sheet (i.e. excellent electronic properties).

Plasma etching is well known in the literature for very precise etching in general and has been found to have particular benefits here. Using this technique, the out-of-plane material can be readily targeted and its removal serves to expose end surfaces of the underlying graphene.

Although the inventors initially found these advantages with ohmic contacts, it was realised that the same benefits can be achieved in all embodiments where charge needs to be extracted out of, or injected into, a graphene sheet. In particular, they found that for biosensor applications the plasma treatment of the surface on which the biosensing material is to be placed gave enhanced electrical measurement sensitivity. While the majority of this application discusses ohmic contacts, it should be appreciated that the benefits apply equally to other applications, including biosensors.

The present invention relates to a method of forming a material on a graphene layer structure. A graphene layer structure may be a graphene monolayer or may comprise a plurality of graphene layers. A graphene layer structure may comprise from 1 to 100 layers, preferably from 1 to 10 layers and most preferably is a monolayer. Preferably, the graphene layer structure comprises a single graphene layer so as to provide the unique and advantageous electronic properties associated with monolayer graphene (such as a substantially zero band gap). Multilayer graphene offers advantageous properties such as improved conduction of both current and heat. However, preferably the graphene layer structure is a monolayer graphene or a bi-layer graphene. This is because the benefits of the surface treatment to remove out-of-plane material will be most noticeable in monolayer and bilayer graphene sheets where changes in the electrical properties are most affected.

The step of providing a graphene layer structure on the substrate may be achieved by any method known in the art. However, preferably the graphene is synthesised directly on the surface of the substrate and therefore does not involve any physical transfer steps. Preferably the graphene is formed by CVD or MOCVD growth. It is particularly preferable that the graphene layer structure is formed by VPE or MOCVD. MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials but would simply require the use of a carbon containing precursor. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. MOCVD is particularly preferred for achieving high quality graphene layer structures.

MOCVD can also be readily distinguished from atomic layer deposition (ALD) techniques. ALD relies on step-wise reactions of reagents with intervening flushing steps used to remove undesirable by products and/or excess reagents. It does not rely on decomposition or dissociation of the reagent in the gaseous phase. It is particularly unsuitable for the use of reagents with low vapour pressures such as silanes, which would take undue time to remove from the reaction chamber. MOCVD growth of graphene is discussed in WO 2017/029470 which is incorporated by reference and provides the preferred method.

The method of WO 2017/029470 provides a chamber which has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron®. Other suitable growth chambers include Turbodisc K-series or Propel MOCVD systems available from Veeco Instruments Inc.

Accordingly, in one particularly preferred embodiment, the step of forming the graphene layer structure comprises:

providing the substrate on a heated susceptor in a reaction chamber, the chamber having a plurality of cooled inlets arranged so that, in use, the inlets are distributed across the substrate and have a constant separation from the substrate, supplying a flow comprising a precursor compound through the inlets and into the reaction chamber to thereby decompose the precursor compound and form the graphene on the substrate, wherein the inlets are cooled to less than 100° C., preferably from 50° C. to 60° C., and the susceptor is heated to a temperature of at least 50° C. in excess of a decomposition temperature of the precursor.

The graphene layer structure may be a doped graphene layer structure. Where the graphene layer structure is doped, the graphene is preferably doped with one or more elements selected from the group consisting of silicon, magnesium, zinc, arsenic, oxygen, boron, bromine and nitrogen. Likewise, the method may then preferably comprise introducing a doping element into the reaction chamber and selecting a temperature of the substrate, a pressure of the reaction chamber and a gas flow rate to produce a doped graphene. Preferably, the precursor for doped graphene growth includes the doping element. Alternatively, the precursor comprising the species (which is carbon) and one or more further precursors comprising the doping element are introduced to the substrate within the reaction chamber; the second precursor being a gas or suspended in gas, to produce a doped graphene.

Although CVD or MOCVD techniques for graphene layer structure formation are preferred, techniques which involve producing the graphene and transferring it to the non-metallic substrate can also be employed. The inventors have found that graphene transfer processes known in the art can lead to defects and out-of-plane material graphene which influence many electronic properties of the graphene layer. Deformations in the graphene layer such as these can create electron hole puddles, band gap openings and carrier scattering. By extension, graphene samples that have been transferred by methods known in the art can suffer from being non uniform from one sample to the next. It is difficult to reliably provide graphene having identical properties from one sample to the next due to the physical uncertainties associated with physical transfer processes. In other words, the physical manipulation of graphene post synthesis may give rise to sustainably different levels of stress and/or strain being applied to the sample, particularly where graphene is transferred onto substrates which are not substantially flat where there is an increased risk of damaging the graphene. Similarly, ensuring consistent and uniform pressure to apply the graphene to the new substrate is known to be problematic. Moreover, the step of removing the carrier, which is typically a polymer carrier used to remove graphene from, for example, a catalytic copper growth substrate, is also problematic. Removal of the polymer carrier may comprise dissolving the polymer with a solvent which may give rise to inconsistent levels of doping and therefore inconsistent graphene transistor products. Such methods are therefore not as appropriate for large scale production as MOCVD where consistency is required.

The material for injecting charge into, or extracting charge out of, the graphene layer structure will depend on the specific application. For an electrical contact such as an ohmic contact, the material will typically be a metal. Preferably the material is a metal and forms one or more electrical contacts. The contacts preferably comprise one or more of titanium, chromium and gold, preferably chromium and/or gold. The contacts are preferably deposited by electron beam deposition, preferably using a mask.

For a biosensor application, the material for injecting charge into, or extracting charge out of, the graphene layer structure will be used to change a current or voltage observed within the graphene layer structure (depending on the device design). Preferably the material is a biosensor material and forms one or more sensor portions for receiving a test sample. Preferably the biosensor material or "biologically sensitive material" comprises an organelle, cell receptor, nucleic acid, enzyme, analyte or antibody. Most preferably the material comprises an enzyme or an antibody. The specific nature of the material will depend on the intended purpose of the end device.

The method comprises providing a graphene layer structure having one or more first portions on a non-metallic substrate, said one or more first portions having excess out-of-plane material.

The non-metallic substrate may be any known in the art. The substrate could have a laminate structure with multiple layers, provided that the upper surface on which the graphene layer structure is to be provided is composed of a non-metallic material. The substrate may comprise silicon, germanium, silicon dioxide, silicon nitride, silicon carbide, sapphire and III-V semiconductor or combinations of two or more thereof. III-V semiconductor substrates may include binary III-V semiconductors such as GaN and AlN and also ternary, quaternary and higher order III-V semiconductors such as InGaN, InGaAs, AlGaN, InGaAsP.

For applications such as Hall sensors or biosensors, where the device is essentially a graphene sheet directly on a substrate with the necessary electrical contacts, silicon and sapphire substrates are most preferred due to their ready availability and relatively lower cost. In more complex applications, the substrate may already be an electronic device precursor, such that the graphene is formed as a contact layer on, for example, an LED stack.

The total thickness of the substrate is typically 50 to 1500 µm, preferably 400 µm to 1200 µm. However, thicker substrates would also work and thick silicon wafers, for example, are up to 2 mm thick. The minimum thickness of the substrate is however determined in part by the substrate's mechanical properties and the maximum temperature at which the substrate is to be heated. The maximum area of the substrate may be dictated by the size of the reaction chamber when forming a graphene layer structure by MOCVD or VPE. Preferably, the substrate has a diameter of at least 15.2 cm (6 inches), preferably 15.2 to 61.0 cm (6 to 24 inches) and more preferably 15.2 to 30.5 cm (6 to 12 inches). The substrate can be cut after growth to form individual devices using any known method. The substrate may instead be cut after formation of an end device, such as a biosensor or a transistor. This is particularly, preferable wherein a plurality of devices are manufactured concomitantly using the method described herein on a single substrate (such as a 6 inch (15 cm) wafer) and cutting provides a plurality of individual devices.

The method further comprises plasma etching the one or more first portions of the graphene layer structure to remove the out-of-plane material. Plasma etching is a form of plasma processing commonly used to fabricate integrated circuits. It involves a high-speed stream of plasma of an appropriate gas mixture being pulsed over a sample. Plasma is highly energetic so that it can affect the surface in a number of different ways including excitation, dissociation and ionisation. However, since the plasma is already energetic, the process can be conducted at temperatures which are sufficiently low that the graphene sheet is not generally degraded. Suitable temperatures are known in the art, and room temperature treatments are preferred.

Preferably the plasma etching is selectively applied to only the one or more first portions leaving one or more untreated second portions. Preferably the method comprises applying a mask to the graphene layer structure before the step of plasma etching the one or more first portions. Such masking techniques are well known in the art and any suitable resist material may be applied to mask the graphene and leave exposed the areas on which the material for injecting charge into, or extracting charge out of, the graphene layer structure is to be deposited.

One approach to targeted plasma etching is to, before the step of plasma etching, coat the graphene layer structure with a coating layer; and then selectively removing the coating layer to expose the one or more first portions for plasma etching. The selective removal can be desirably achieved with known techniques such as laser etching.

Another approach to targeted plasma etching is before the step of plasma etching:
coating the graphene layer structure through a mask to form a coating layer which does not cover the first portions.

Preferably the coating layer used in the above embodiments is an organic resist or an inorganic coating layer, preferably wherein the organic resist comprises one or more components selected from the list consisting of aromatic hydrocarbons, carbonyls, alcohols, carboxylic acids, esters, amines, siloxanes, aliphatic hydrocarbons, and urethanes. An exemplary organic coating layer is a polymer such as PMMA. Suitable inorganic coating layer materials include alumina, silica and the like.

Preferably the plasma gas mixture comprises one or more of nitrogen, argon, neon, oxygen and hydrogen gases. Preferably the plasma etching is oxygen-plasma etching. That is, the plasma gas is preferably oxygen, since this can be used to liberate carbon atoms from the out-of-plane material as stable carbon monoxide or carbon dioxide molecules. Preferably the oxygen-plasma etching comprises a flow of up to 50 sccm $O_2$, preferably up to 25 sccm $O_2$ and most preferably up to 10 sccm $O_2$. Suitable apparatus and conditions for plasma etching are known in the electrical device fabrication field.

Preferably the one or more plasma-etched first portions have a substantially planar surface with exposed edge surfaces and preferably the substantially planar surface comprises no excess out-of-plane material extending more than 0.5 nm from said surface, preferably no more than 0.1 nm.

The method further comprises depositing a material for injecting charge into, or extracting charge out of, the graphene layer structure onto the one or more plasma-etched first portions. Depending on the material selected as discussed above, suitable deposition techniques may vary. Suitable deposition techniques for metal contacts include e-beam deposition, while biosensor materials may be directly coated or printed as appropriate.

In a preferred embodiment, the method provides forming electrical contacts on a graphene layer structure, the method comprising:
  providing a graphene layer structure having one or more intended contact portions on a non-metallic substrate, said one or more intended contact portions having one or more surface defects comprising excess out-of-plane material;
  oxygen-plasma etching the one or more intended contact portions of the graphene layer structure to remove the out-of-plane material;

depositing metal contacts onto the one or more oxygen-plasma-etched intended contact portions.

In a preferred embodiment, the method provides forming a biosensor, the method comprising:
providing a graphene layer structure having one or more intended sensor portions on a non-metallic substrate, said one or more intended sensor portions having one or more surface defects comprising excess out-of-plane material;
oxygen-plasma etching the one or more intended sensor portions of the graphene layer structure to remove the out-of-plane material;
depositing a biosensor material onto the one or more oxygen-plasma-etched intended sensor portions.

As will be appreciated, while the present disclosure focusses on the production of improved electrical contacts, the method may be used as part of the manufacture of a complete electronic device. Accordingly, the steps described herein may be interspersed between the additional steps of depositing (or removing) additional material layers to produce a final device. For example, an end device might comprise a graphene layer with a metal contact having an improved electrical connection, but also have an LED device stack formed on a further portion of the graphene layer.

According to a further aspect there is provided an electronic component comprising one or more metal contacts, wherein the electronic component comprises a graphene layer structure on a substrate, the graphene layer structure having a substantially continuous surface, the surface having one or more metal contacts, each on one or more portions of said surface, wherein each portion of the surface having a metal contact thereon has a flat planar surface and one or more surface discontinuities, wherein the metal contact lies across and within the one or more surface discontinuities.

The electronic component may be obtainable by the method described herein and, accordingly, all features described in relation to the first aspect may be applied equally to this further aspect.

Preferably each surface discontinuity provides exposed edges of graphene sheets within the graphene layer structure, the exposed edges separated on average by less than 1 nm, preferably less than 0.5 nm.

According to a further aspect there is provided an electronic component for biosensing, wherein the electronic component comprises a graphene layer structure on a substrate, the graphene layer structure having a substantially continuous surface, the surface having a biosensor material on at least one portion thereof, wherein the one or more portions of the surface having the biosensor material thereon have a flat planar surface and one or more surface discontinuities, wherein the biosensor material lies across and within the one or more surface discontinuities.

The electronic component may be obtainable by the method described herein and, accordingly, all features described in relation to the first aspect may be applied equally to this further aspect. Equally, all features described in relation to the electronic component comprising one or more metal contacts may be applied equally to this further aspect.

The inventors have found that by plasma etching the excess out-of-plane material (i.e. wrinkles) in a first portion of the graphene layer structure, the first portion will retain a substantially continuous surface. That is, the electrical continuity of the graphene will remain substantially unaffected by the etching of the out-of-plane material. Additionally, the etched first portion will have, as a result of the method, a flat planar surface. Whilst graphene may be described in the art as a flat two-dimensional material, it is well understood that graphene, in particular graphene provided by transfer processing from a growth substrate (e.g. a copper substrate), has numerous defects, at least in the form of wrinkles. Accordingly, whilst theoretically flat, practically, graphene is known to inevitably comprise out-of-plane material and would not be considered to have a flat planar surface within the meaning of the present electronic component.

As described herein, even where graphene is grown directly on the substrate intended for use in a subsequent device (such as sapphire), cooling after growth leads to the formation of wrinkles due to the difference in thermal expansion coefficients of the substrate and graphene.

The electronic components obtainable by the method of the present invention comprise a graphene layer structure wherein a first portion thereof, having a metal contact or biosensor material thereon, have a flat planar surface. As will be appreciated, the metal contact or biosensor material is provided substantially across the continuous surface of the first portion whereby a minimal portion is then provided within the surface discontinuity contacting the edges of the graphene. That is, the size (i.e. the area) of the surface discontinuities are substantially smaller than the total area of the first portion which is contacted by the metal or biosensor material, typically less than 25%, preferably less than 15%, preferably less than 10%, preferably less than 5%, and most preferably less than 1%.

As a result, it will be appreciated that the metal contact or biosensor material provided on the first portion does not contact graphene having excess out-of-plane material in view of the method of etching the out-of-plane material in the first portion. Thus, unlike the prior art whereby a mask may be used to define and etch holes and/or apertures in graphene for receiving, for example, a biosensor material which resides either solely within the hole or across an adjacent non-flat planar surface of the graphene, the present components comprises a flat planar surface upon which a metal contact or biosensor material is in contact and thereby filling the minimal surface discontinuities resulting from the wrinkle etching.

Biosensors will now be discussed in more detail. A biosensor typically consists of a bioreceptor (enzyme/antibody/cell/nucleic acid/aptamer), transducer component (semi-conducting material/nanomaterial), and electronic system which includes a signal amplifier, processor & display. The bioreceptor is designed to interact with the specific analyte of interest to produce an effect measurable by the transducer. High selectivity for the analyte among a matrix of other chemical or biological components is a key requirement of the bioreceptor. While the type of biomolecule used can vary widely, biosensors can be classified according to common types of bioreceptor interactions involving: antibody/antigen, enzymes/ligands, nucleic acids/DNA, cellular structures/cells, or biomimetic materials.

An important part in a biosensor is to attach the biological elements (small molecules/protein/cells) to the surface of the sensor (graphene in this case). The simplest way is to functionalize the surface in order to coat it with the biological elements or to entrap the biosensor material in a three-dimensional lattice (such as a hydrogel). Suitable techniques are well known in the art and would be selected by the skilled person, depending on the sensor design of interest.

The sensor substrate may contain three electrodes; a reference electrode, a working electrode and a counter electrode. The target analyte is involved in the reaction that takes place on the active electrode surface, and the reaction may cause either electron transfer across the double layer (producing a current) or can contribute to the double layer potential (producing a voltage). One can either measure the current (rate of flow of electrons is now proportional to the analyte concentration) at a fixed potential or the potential can be measured at zero current (this gives a logarithmic response).

A potentiometric biosensor, (potential produced at zero current) gives a logarithmic response with a high dynamic range. Such biosensors have only two electrodes and are extremely sensitive and robust. They enable the detection of analytes at levels previously only achievable by HPLC and LC/MS and without rigorous sample preparation.

Field effect transistor designs, in which the gate region has been modified with an enzyme or antibody, can also detect very low concentrations of various analytes as the binding of the analyte to the gate region of the FET cause a change in the drain-source current. This is a preferred design, wherein the gate region is applied in the configuration shown in FIG. 5.

In a preferred embodiment, there is provided an electronic component for biosensing, wherein the electronic component comprises a graphene layer structure on a substrate, the graphene layer structure (preferably a monolayer) having a substantially continuous surface, the surface having a biosensor material on at least one portion thereof, wherein the one or more portions of the surface having the biosensor material thereon have a flat planar surface and one or more surface discontinuities, wherein the biosensor material lies across and within the one or more surface discontinuities, and wherein the biosensor material is arranged between a source and a drain electrode provided on the substantially continuous surface, and preferably wherein the component further comprises a gate electrode arranged on a distal surface from the graphene and aligned with at least a portion of the biosensor material.

Figure 1B:
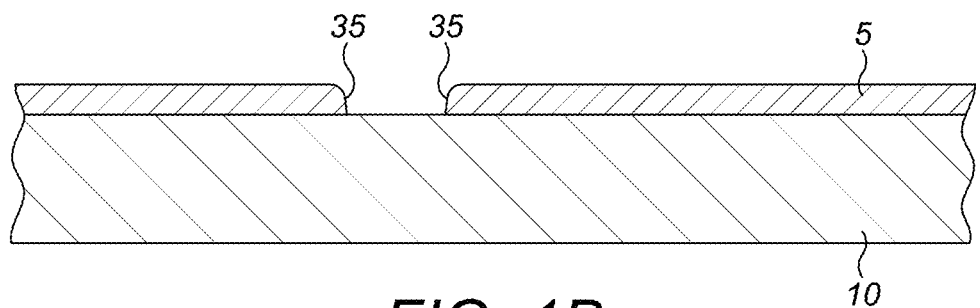
Figure 1C:
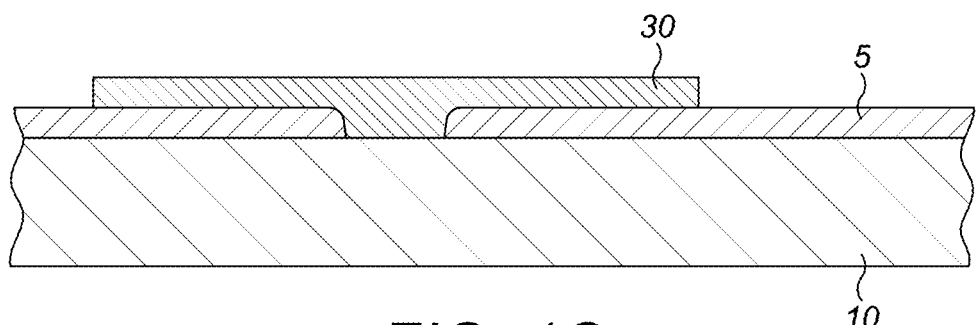

The present invention will now be described further with reference to the following non-limiting Figures, in which:

FIG. 1A-C show the stepwise treatment method as described herein. FIG. 1A shows a graphene layer structure 5, preferably a monolayer, provided on a silicon substrate 10. The graphene layer structure 5 comprises a wrinkle 15 providing an amount of material which is in an out-of-plane region 20. The wrinkle 15 falls within an area 25 intended for an electrical contact 30.

FIG. 1B shows the graphene layer structure 5 after an oxygen-plasma treatment of the area 25 only, whereby the graphene material forming the wrinkle 15 has been etched away. This leaves exposed edge surfaces 35 of the graphene layer structure.

FIG. 1C shows the graphene layer structure 5 after a contact deposition step, whereby a contact 30 is formed on the area 25 and the contact 30 is provided in contact with the exposed edge surfaces 35. Thus, an electronic component comprising a contact 30 deposited by such a method can be differentiated from the prior art at least by virtue of the whole of the area 25 having the contact 30 has a flat planar surface.

Figure 2:
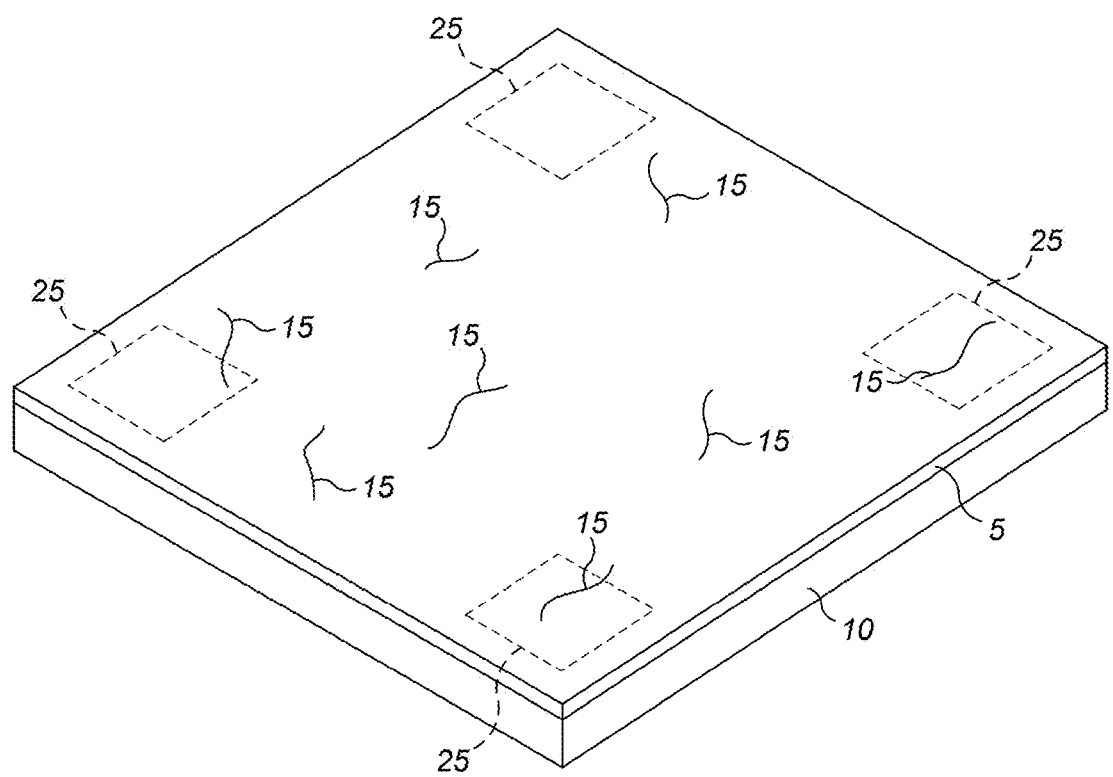
FIG. 2 shows a perspective view of a graphene layer structure to be treated.

FIG. 2 shows a perspective view of a graphene layer structure to be treated. FIG. 2 shows the graphene layer structure 5 having the areas 25 intended for an electrical contact 30. Only the wrinkles and surface defects in the areas 25 are treated, since treating the wrinkles across the sheet would lead to breaks in the electrical conductivity of the sheet as a whole. By only treating the areas where electrical contacts are to be deposited, the electrical connectivity of the contacts is improved.

Figure 3A:
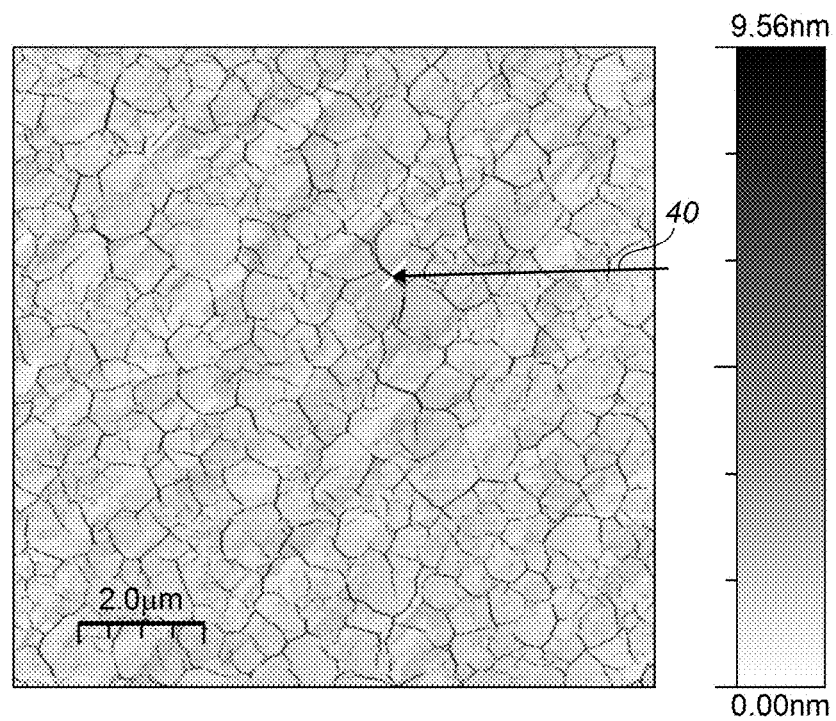
FIG. 3A shows an atomic force microscope (AFM) image of the surface of a graphene sheet with surface wrinkles.
Figure 3B:
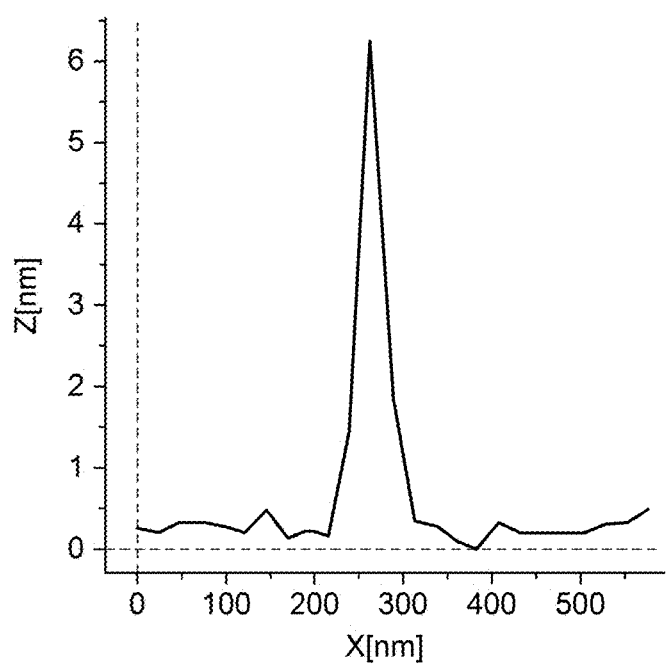
FIG. 3B shows the AFM height profile of the wrinkle relative to the graphene surface along a line marked out with an arrow 40 in FIG. 3A.

FIG. 3A shows an atomic force microscope (AFM) image of the surface of a graphene sheet with surface wrinkles. FIG. 3B shows the AFM height profile of the wrinkle relative to the graphene surface along a line marked out with an arrow in FIG. 3A.

Figure 4A:
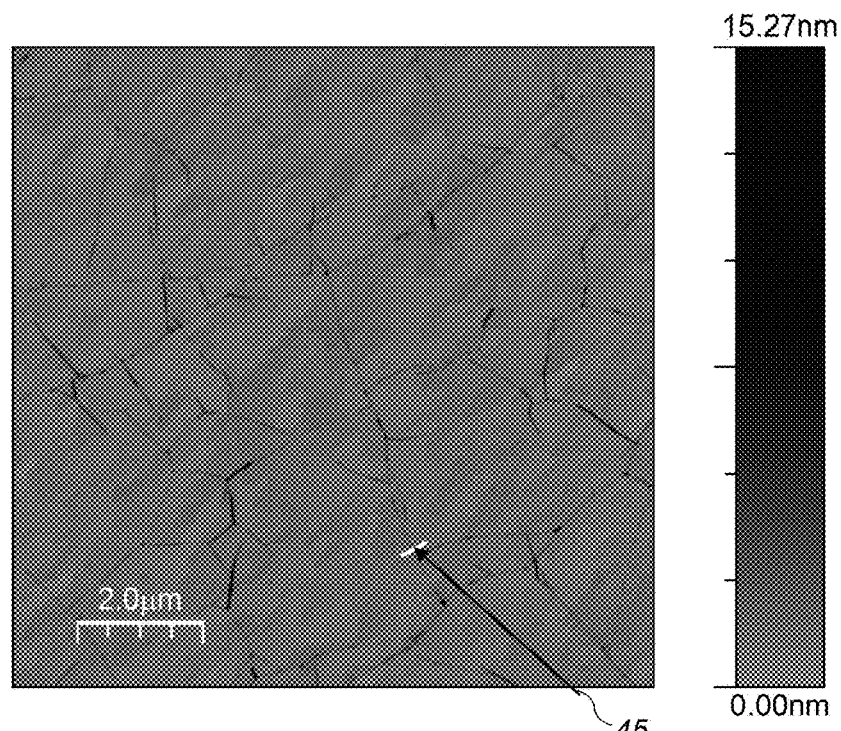
FIG. 4A shows an AFM image of the surface of a graphene sheet with surface wrinkles.
Figure 4B:
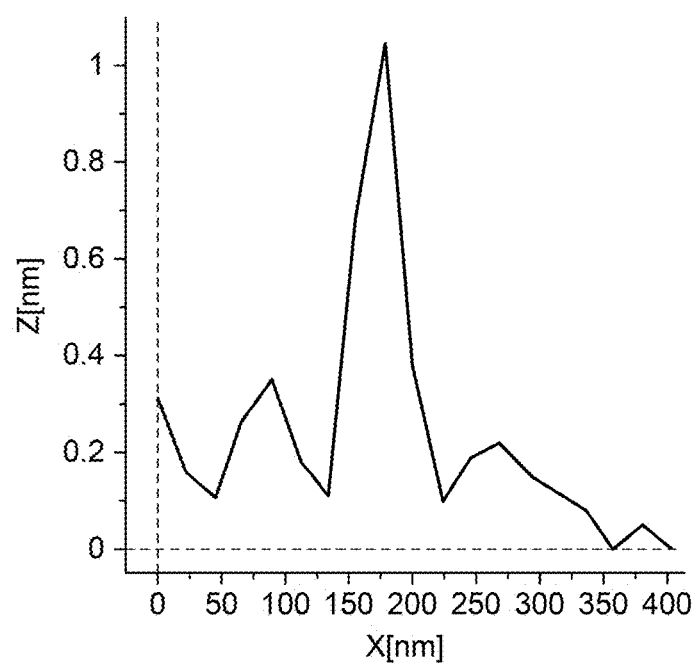
FIG. 4B shows the AFM height profile of the wrinkle relative to the graphene surface along a line marked out with an arrow 45 in FIG. 4A.

FIG. 4A shows an AFM image of the surface of a graphene sheet with surface wrinkles. FIG. 4B shows the AFM height profile of the wrinkle relative to the graphene surface along a line marked out with an arrow in FIG. 4A. FIG. 4A relates to a graphene sheet with a lower wrinkle density than FIG. 3A.

FIG. 5 shows a configuration of a biosensor.

EXAMPLES

Examples were prepared to investigate the effect of different powers of plasma on the contact resistance between Ti/Au contacts and graphene.

Preparation of Samples
1. Laser etch 3 wafers of graphene on sapphire to form device precursors (Hall crosses and TLM bars);
2. Spin on PMMA/F4TCNQ, anneal for 1.5 hours;
3. Etch out contacts areas in the PMMA/F4TCNQ layer with laser.
4. Plasma treatment with a 100 W plasma etching device at 3 different plasma powers for the 3 wafers: 1×20% plasma, 1×30% plasma, 1×40% plasma.
5. Align shadow mask with devices on wafer.
6. Evaporate 10 nm Ti/60 nm Au as contacts.

Measurements and Analysis

For Hall crosses, perform Hall measurements.

For TLM bars, measure resistance between pairs of adjacent contacts with increased separations, coded: 1-2, 2-3, 3-4, 4-5, 5-6, 6-7, 7-8. Plot graph of resistance against distance between contacts d, fit a line of best fit. With line of best fit, $$\text{gradient} = \text{gradient} = \frac{Rs}{W},$$

where Rs is sheet resistance and W is width of bar; y-intercept=2× contact resistance.

Results

Hall Measurements on Hall Crosses

The temperature corrected Hall sensitivities $R_H$ were similar for the 3 samples, ranging between −984 V/AT to −1080 V/AT.

With increasing plasma power from 20% to 40%, the sheet resistance $\rho_s$ decreased from 10598Ω/□ to 7504Ω/□. The total resistance across contacts 1/3 and 2/4 (also known as R13 and R24, respectively) also decreased with increasing plasma power.

The sheet resistance $\rho_s$ is measured using the Van de Pauw method by the Hall measurement system and is independent of the Hall sensitivity. We can calculate the resistance of the graphene $R_{Gr}$ by multiplying the sheet resistance by 7/3 (geometry factor for standard Hall cross). The average total resistance across a Hall cross can be calculated as an average of R13 and R24, R_Ave. In theory, the expected 2× contact resistance $R_c$ is the difference between R_Ave and Calculated $R_{Gr}$. The expected $2R_c$ is lowest for a plasma power of 40% compared with 20% and 30%.

| FIG. 1 Hall measurements of Hall crosses for different plasma powers. | | | | | | | |
|---|---|---|---|---|---|---|---|
| Plasma % | $R_H$ (T corrected) V/AT | $\rho_s$ $\Omega/\square$ | R13 $\Omega$ | R24 $\Omega$ | R_Ave $\Omega$ | Calculated $R_{Gr}$ $\Omega$ | Expected 2 $R_c$ $\Omega$ |
| 20 | −984 | 10,598 | 25,825 | 29,145 | 27,485 | 24,728 | 2,757 |
| 30 | −1,080 | 8,998 | 21,740 | 26,250 | 23,995 | 20,996 | 2,999 |
| 40 | −1,043 | 7,504 | 18,113 | 20,465 | 19,289 | 17,509 | 1,780 |

TLM Bars

In comparison to previous TLM study for graphene with no plasma treatment, the contact resistance for all powers studied (20%, 30%, 40%) has decreased to a level that is within the error of the measurements, with the y-axis intercept hovering around zero.

A comparison of sheet resistance $\rho_s$ between Hall crosses and TLM bar was made to verify the trend of decreasing $\rho_s$ with increasing plasma power.

Results from the TLM bars show that contact resistance of the plasma treated samples has decreased. The results also show that sheet resistance can be reduced with increasing plasma power. While 20% and 30% plasma power increasingly etched away at the graphene wrinkles, it is believed that 40% eliminated further graphene, resulting in direct edge contact between Ti/Au and graphene.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The present invention will now be described further in the following clauses:

1. A method of forming a material on a graphene layer structure for injecting charge into, or extracting charge out of, the graphene layer structure, the method comprising:
   providing a graphene layer structure having one or more first portions on a non-metallic substrate, said one or more first portions having one or more surface defects comprising excess out-of-plane material;
   plasma etching the one or more first portions of the graphene layer structure to remove the out-of-plane material;
   depositing a material for injecting charge into, or extracting charge out of, the graphene layer structure onto the one or more plasma-etched first portions.

2. The method according to clause 1, wherein the material is a metal and forms one or more electrical contacts.

3. The method according to clause 1, wherein the material is a biosensor material and forms one or more sensor portions for receiving a test sample.

4. The method according to any preceding clause, wherein the plasma etching is oxygen-plasma etching.

5. The method according to clause 4, wherein the oxygen-plasma etching comprises a flow of up to 50 sccm $O_2$, preferably up to 25 sccm $O_2$ and most preferably up to 10 sccm $O_2$.

6. The method according to any preceding clause, wherein the plasma etching is selectively applied to only the one or more first portions leaving one or more untreated second portions, preferably wherein the method comprises applying a mask to the graphene layer structure before the step of plasma etching the one or more first portions.

7. The method according to any preceding clause, wherein the out-of-plane material comprises wrinkles resulting from a mismatch in thermal expansion coefficients between the graphene layer structure and the non-metallic substrate, or domain over-growth resulting from graphene growth during graphene layer structure formation.

8. The method according to any preceding clause, wherein the graphene is formed by CVD or MOCVD growth.

9. The method according to any preceding clause, wherein the one or more plasma-etched first portions have a substantially planar surface and preferably the substantially planar surface comprises no excess out-of-plane material extending more than 0.5 nm from said surface.

10. The method according to any preceding clause, wherein the graphene layer structure is a monolayer graphene or a bi-layer graphene.

11. The method according to any preceding clause, wherein the method further comprises before the step of plasma etching:
   coating the graphene layer structure with a coating layer;
   selectively removing the coating layer to expose the one or more intended plasma portions.

12. The method according to any of clauses 1 to 10, wherein the method further comprises before the step of plasma etching:
   coating the graphene layer structure through a mask to form a coating layer which does not cover the first portions.

13. The method according to clause 11 or clause 12, wherein the coating layer is an organic resist or an inorganic coating layer, preferably wherein the organic resist comprises one or more components selected from the list consisting of aromatic hydrocarbons, carbonyls, alcohols, carboxylic acids, esters, amines, siloxanes, aliphatic hydrocarbons, and urethanes.

14. An electronic component comprising one or more metal contacts, wherein the electronic component comprises a graphene layer structure on a substrate, the graphene layer structure having a substantially continuous surface, the surface having one or more metal contacts, each on one or more portions of said surface,
   wherein each portion of the surface having a metal contact thereon has a flat planar surface and one or more surface discontinuities, wherein the metal contact lies across and within the one or more surface discontinuities.

15. An electronic component for biosensing, wherein the electronic component comprises a graphene layer structure on a substrate, the graphene layer structure having a substantially continuous surface, the surface having a biosensor material on at least one portion thereof,
   wherein the one or more portions of the surface having the biosensor material thereon have a flat planar surface and one or more surface discontinuities, wherein the biosensor material lies across and within the one or more surface discontinuities.

16. The electronic component according to clause 14 or clause 15, wherein each surface discontinuity provides exposed edges of graphene sheets within the graphene layer structure, the exposed edges separated on average by less than 1 nm, preferably less than 0.5 nm.

17. The electronic component according to any of clauses 14 to 16, wherein the graphene layer structure is coated with a coating layer which does not cover the one or more portions, wherein the coating layer is an organic resist or an inorganic coating layer.

18. The electronic component according to any of clauses 14 to 17, wherein the component is obtainable by the method of any of clauses 1 to 13.

The invention claimed is:

1. A method of forming a material on a graphene layer structure for injecting charge into, or extracting charge out of, the graphene layer structure, the method comprising:
   providing a graphene layer structure having one or more first portions on a non-metallic substrate, said one or more first portions having one or more surface defects comprising excess out-of-plane material;
   plasma etching the one or more first portions of the graphene layer structure to remove the out-of-plane material;
   depositing a material for injecting charge into, or extracting charge out of, the graphene layer structure onto the one or more plasma-etched first portions.

2. The method according to claim 1, wherein the material is a metal and forms one or more electrical contacts.

3. The method according to claim 1, wherein the material is a biosensor material and forms one or more sensor portions for receiving a test sample.

4. The method according to claim 1, wherein the plasma etching is oxygen-plasma etching.

5. The method according to claim 1, wherein the plasma etching is selectively applied to only the one or more first portions leaving one or more untreated second portions.

6. The method according to claim 1, wherein the out-of-plane material comprises wrinkles resulting from a mismatch in thermal expansion coefficients between the graphene layer structure and the non-metallic substrate, or domain over-growth resulting from graphene growth during graphene layer structure formation.

7. The method according to claim 1, wherein the graphene is formed by CVD or MOCVD growth.

8. The method according to claim 1, wherein the one or more plasma-etched first portions have a substantially planar surface.

9. The method according to claim 8, wherein the substantially planar surface comprises no excess out-of-plane material extending more than 0.5 nm from said surface.

10. The method according to claim 1, wherein the graphene layer structure is a monolayer graphene or a bi-layer graphene.

11. The method according to claim 1, wherein the method further comprises before the step of plasma etching:
   coating the graphene layer structure with a coating layer;
   selectively removing the coating layer to expose the one or more intended plasma portions.

12. The method according to claim 11, wherein the coating layer is an organic resist or an inorganic coating layer.

13. The method according to claim 1, wherein the method further comprises before the step of plasma etching:
   coating the graphene layer structure through a mask to form a coating layer which does not cover the first portions.

14. The method according to claim 13, wherein the coating layer is an organic resist or an inorganic coating layer.

* * * * *